(12) United States Patent
Wang et al.

(10) Patent No.: US 11,283,044 B2
(45) Date of Patent: Mar. 22, 2022

(54) ELECTROLUMINESCENT DISPLAY PANEL HAVING PIXEL STRUCTURE ARRAY INCLUDING SUB-PIXELS WITH CURVE-SHAPED EDGES

(71) Applicant: BOE TECHNOLOGY GROUP CO., LTD., Beijing (CN)

(72) Inventors: Tao Wang, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 16/066,186

(22) PCT Filed: Nov. 9, 2017

(86) PCT No.: PCT/CN2017/110196
§ 371 (c)(1),
(2) Date: Jun. 26, 2018

(87) PCT Pub. No.: WO2018/157620
PCT Pub. Date: Sep. 7, 2018

(65) Prior Publication Data
US 2019/0312225 A1    Oct. 10, 2019

(30) Foreign Application Priority Data

Mar. 2, 2017    (CN) .......................... 201710121144.6

(51) Int. Cl.
*H01L 51/52*    (2006.01)
*H01L 27/32*    (2006.01)
(Continued)

(52) U.S. Cl.
CPC .......... *H01L 51/5253* (2013.01); *H01L 27/32* (2013.01); *H01L 27/3218* (2013.01);
(Continued)

(58) Field of Classification Search
CPC ..... H01L 51/5253; H01L 51/52; H01L 51/56; H01L 51/0097; H01L 27/32; H01L 27/3218
See application file for complete search history.

(56) References Cited

U.S. PATENT DOCUMENTS 6,008,582 A  *  12/1999  Asano ...................... H01J 11/12
                                                    313/582
7,459,322 B2     12/2008  Ito et al.
(Continued)

FOREIGN PATENT DOCUMENTS

CN          102132630 A       7/2011
CN          103187533 A       7/2013
(Continued)

OTHER PUBLICATIONS

Search Report and Written Opinion dated Feb. 9, 2018 from State Intellectual Property Office of the P.R. China.
(Continued)

*Primary Examiner* — Matthew E. Gordon
(74) *Attorney, Agent, or Firm* — Dilworth & Barrese, LLP.; Michael J. Musella, Esq.

(57) ABSTRACT

An electroluminescent display panel and manufacturing method thereof, and a display device are provided. The electroluminescent display panel includes a base substrate, pixel structures disposed on the base substrate; and an encapsulating layer disposed on the pixel structures. The pixel structures are arranged in an array, the pixel structure including a plurality of sub-pixels arranged in an array, the pixel structure array has a first direction and a second direction intersected with each other, the edge of the sub-pixel including a first portion gradually away from a straight
(Continued)

line where the first direction lies, and an extending direction of the first portion does not coincide with the second direction.

20 Claims, 5 Drawing Sheets

(51) Int. Cl.
*H01L 51/00* (2006.01)
*H01L 51/56* (2006.01)

(52) U.S. Cl.
CPC ...... *H01L 27/3246* (2013.01); *H01L 51/0097* (2013.01); *H01L 51/52* (2013.01); *H01L 51/56* (2013.01); *H01L 2227/323* (2013.01); *H01L 2251/5338* (2013.01); *H01L 2251/558* (2013.01)

(56) References Cited

U.S. PATENT DOCUMENTS

| | | | |
|---|---|---|---|
| 7,781,956 B2 | 8/2010 | Takagi et al. | |
| 9,263,676 B2 | 2/2016 | Lee et al. | |
| 10,032,835 B2 | 7/2018 | Min et al. | |
| 2004/0009303 A1* | 1/2004 | Ito | H01L 27/3246 313/483 |
| 2010/0200846 A1 | 8/2010 | Kwack et al. | |
| 2011/0108859 A1* | 5/2011 | Oosako | H01L 27/3246 257/88 |
| 2013/0057521 A1 | 3/2013 | Kim | |
| 2014/0097418 A1* | 4/2014 | Kim | H01L 51/5246 257/40 |
| 2014/0134362 A1 | 5/2014 | Iwase et al. | |
| 2014/0183479 A1* | 7/2014 | Park | H01L 51/56 257/40 |
| 2014/0240827 A1 | 8/2014 | Asai et al. | |
| 2015/0171327 A1* | 6/2015 | Matsushima | H01L 27/3246 257/40 |
| 2017/0005151 A1 | 1/2017 | Kim et al. | |
| 2018/0197924 A1* | 7/2018 | Tada | H01L 27/323 |

FOREIGN PATENT DOCUMENTS

| | | |
|---|---|---|
| CN | 103715222 A | 4/2014 |
| CN | 103811533 A | 5/2014 |
| CN | 104009186 A | 8/2014 |
| CN | 104010185 A | 8/2014 |
| JP | 2003270422 A | 9/2003 |
| JP | 2008226746 A | 9/2008 |
| JP | 2013043382 A | 3/2013 |
| JP | 2014103111 A | 6/2014 |
| JP | 2015023023 A | 2/2015 |
| JP | 2015069857 A | 4/2015 |
| WO | 2015113382 A1 | 6/2015 |

OTHER PUBLICATIONS

First Chinese Office Action dated Dec. 31, 2019.
Extended European Search Report from Corresponding European Patent Application No. 17882279.7 dated Nov. 4, 2020.
Indian Office Action from Corresponding Indian Patent Application No. 201817024095 dated Sep. 15, 2020.
First Japanese Office Action from Japanese Patent Application No. 2018533942 dated Jun. 28, 2021.

* cited by examiner

ELECTROLUMINESCENT DISPLAY PANEL HAVING PIXEL STRUCTURE ARRAY INCLUDING SUB-PIXELS WITH CURVE-SHAPED EDGES

CROSS REFERENCE TO RELATED APPLICATIONS

The present application claims priority of Chinese patent application No. 201710121144.6, filed on Mar. 2, 2017 with SIPO, which is incorporated herein by reference in its entirety.

TECHNICAL FIELD

Embodiments of the present disclosure relate to an electroluminescent display panel and a manufacturing method thereof, and a display device.

BACKGROUND

OLED (Organic Light-Emitting Diode) devices are widely applied in the display field as they possess the excellent characteristics of self-light-emitting, no backlight source, high contrast, thin thickness, wide viewing angle, fast response speed, usable for flexible panels, wide use temperature range, simple construction and producing process and so on.

The life issue of OLED devices restricts the pace of their industrialization, in the process of manufacturing OLED devices, it is necessary that a pixel defining region is produced on a base substrate, then an organic light-emitting material be evaporated into the pixel defining region by a vacuum evaporation process. The organic light-emitting material is extremely sensitive to water and oxygen, thus, it is necessary to conduct film encapsulation or to conduct encapsulation by fringe coating after the evaporation is finished. Otherwise, the life of OLED devices will be reduced. At present, the encapsulating approach includes two ways: film encapsulating and fringe coating. The structure of the film encapsulating process is a structure in which multiple layers consisting of an organic layer and an inorganic layer are stacked. In the structure in which multiple layers consisting of an organic layer and an inorganic layer are stacked, the inorganic layer can function as an obstruction to water/oxygen, and the organic layer can function as a planarization. The approach of fringe coating is adding a flaky desiccant into a non-display region or coating a circle of desiccant at the edge of the display, and the above approach of fringe coating is unfavorable for a narrow frame design.

SUMMARY

At least one embodiment of the present disclosure provides an electroluminescent display panel, comprising, a base substrate, pixel structures provided on the base substrate; an encapsulating film provided on the pixel structures, wherein the pixel structures are arranged in an array, the pixel structure includes a plurality of sub-pixels arranged in an array, the pixel structure array has a first direction and a second direction intersected with each other, an edge of each of the sub-pixels includes a first portion gradually away from a straight line where the first direction lies, and an extending direction of the first portion does not coincide with the second direction.

For example, in the electroluminescent display panel of at least one embodiment of the present disclosure, the first portion is a substantial curve.

For example, in the electroluminescent display panel of at least one embodiment of the present disclosure, each of the sub-pixels has a shape including at least one of a circle, ellipse, and a quadrangle which is snake-liked along the first direction.

For example, in the electroluminescent display panel of at least one embodiment of the present disclosure, shape of each opening region corresponding to each of the sub-pixels includes a polygon whose side number is greater than four.

For example, in the electroluminescent display panel of at least one embodiment of the present disclosure, in the first direction, adjacent sub-pixels are symmetrically arranged with respect to a straight line where the second direction lies; in the second direction, adjacent sub-pixels are symmetrically arranged with respect to the straight line where the first direction lies.

For example, in the electroluminescent display panel of at least one embodiment of the present disclosure, each of the OLED pixel structure includes a first sub-pixel, a second sub-pixel and a third sub-pixel.

For example, in the electroluminescent display panel of at least one embodiment of the present disclosure, the encapsulating film at least includes an inorganic insulating layer and an organic insulating layer arranged one on the other.

For example, in the electroluminescent display panel of at least one embodiment of the present disclosure, the inorganic insulating layer includes a first inorganic insulating layer provided between the organic insulating layer and the OLED pixel structures, and a second inorganic insulating layer disposed on the organic insulating layer.

For example, in the electroluminescent display panel of at least one embodiment of the present disclosure, material of the organic insulating layer includes at least one of acrylic resins.

For example, in the electroluminescent display panel of at least one embodiment of the present disclosure, materials of the first inorganic insulating layer and second inorganic insulating layer each includes at least one of silicon nitride (SiNx), silicon oxide (SiOx), silicon oxynitride (SiNOx), titanium dioxide ($TiO_2$) and aluminium oxide ($Al_2O_3$).

For example, in the electroluminescent display panel of at least one embodiment of the present disclosure, the OLED pixel structures include a first electrode, an organic material functional layer, and a second electrode, which are arranged one on another.

For example, in the electroluminescent display panel of at least one embodiment of the present disclosure, the organic functional layer includes a light-emitting layer, an electron injection layer, an electron transportation layer, a hole injection layer and a hole transportation layer.

For example, the electroluminescent display panel of at least one embodiment of the present disclosure further comprises a pixel defining layer provided among adjacent OLED pixel structures, wherein each of the sub-pixels corresponds to an opening region of the pixel defining layer, and thickness of the pixel defining layer is in a range of 1 μm to 1.5 μm.

For example, in the electroluminescent display panel of at least one embodiment of the present disclosure, the electroluminescent display panel is a flexible display panel.

At least one embodiment of the present disclosure also provides a display device, comprising any of the electroluminescent display panels.

At least one embodiment of the present disclosure provides a manufacturing method of an electroluminescent display panel, comprising, forming pixel structures on a base substrate; and forming an encapsulating film covering the pixel structures on the pixel structures. The pixel structures are arranged in an array, each of the pixel structures includes a plurality of sub-pixels arrange in an array, the array of pixel structures has a first direction and a second direction intersected with each other, an edge of each of the sub-pixels includes a first portion gradually away from a straight line where the first direction lies, and an extending direction of the first portion does not coincide with the second direction.

For example, in the manufacturing method of at least one embodiment of the present disclosure, the encapsulating film at least includes an inorganic insulating layer and an organic insulating layer arranged one on the other.

For example, in the manufacturing method of at least one embodiment of the present disclosure, the inorganic insulating layer includes a first inorganic insulating layer provided between the organic insulating layer and the pixel structures, and a second inorganic insulating layer disposed on the organic insulating layer.

For example, in the manufacturing method of at least one embodiment of the present disclosure, forming of the encapsulating film at least includes forming the organic insulating layer by coating, ink-jet printing or printing.

For example, the manufacturing method of at least one embodiment of the further comprises forming a pixel defining layer among adjacent pixel structures, each of the sub-pixels corresponding to an opening region of the pixel defining layer, and thickness of the pixel defining layer being in a range of 1 μm to 1.5 μm.

BRIEF DESCRIPTION TO THE DRAWINGS

To illustrate the technical solution of the embodiments of the present disclosure more clearly, the accompanied drawings of the embodiments will be briefly introduced below. It is apparent that the accompanied drawings as described below are only related to some embodiments of the present disclosure, but not limitative of the present disclosure.

DETAILED DESCRIPTION

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

After evaporation of an organic light-emitting material in an organic light-emitting device (OLED) is finished, it is generally required to conduct film encapsulation. The process of film encapsulation generally includes a first deposition of an inorganic film layer, preparation of an organic film layer and a second deposition of an inorganic film layer. The production process of the organic film layer includes coating of an organic insulating material, leveling of the organic insulating material and solidifying of the organic insulating material to form an organic film.

It is to be noted that leveling refer to a process in which the coated organic droplets are spread out and a part of solvent is volatilized after an organic insulating material is coated, and before the organic insulating material is dried and formed into a film.

Figure 1:
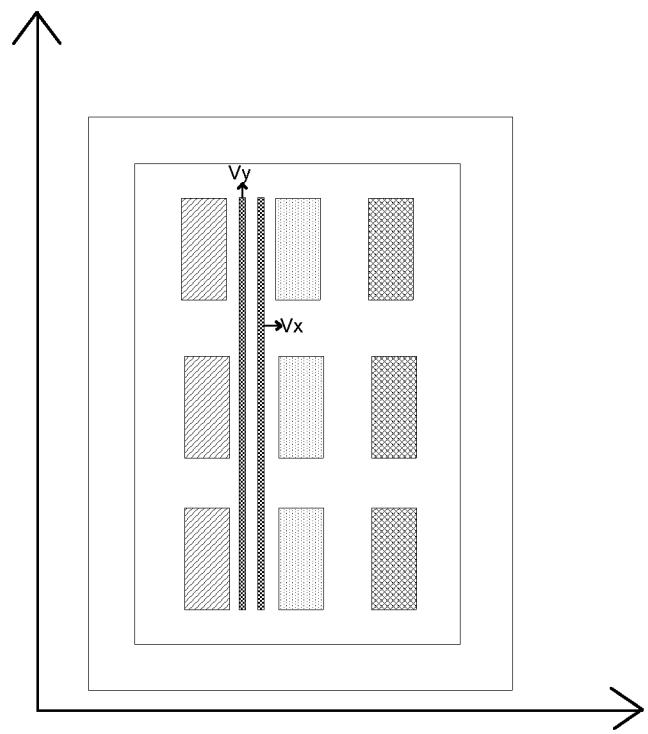
FIG. 1 is a schematically structural plan view illustrating a pixel edge morphology.

In a common organic light-emitting device (OLED), morphology of the edge of each sub-pixel is a rectangle. For example, FIG. 1 is a schematically structural plan view illustrating a pixel edge morphology, in which the sub-pixels are arranged into an array/matrix structure, and edges of each sub-pixel in the transverse direction and in the longitudinal direction are straight lines. When an organic film layer is formed on the structure as shown in FIG. 1, an organic insulating material will be evenly coated, so as to allow the whole face of the organic film layer to be uniform after the subsequent leveling, and to avoid occurrence of mura as much as possible.

Figure 2:
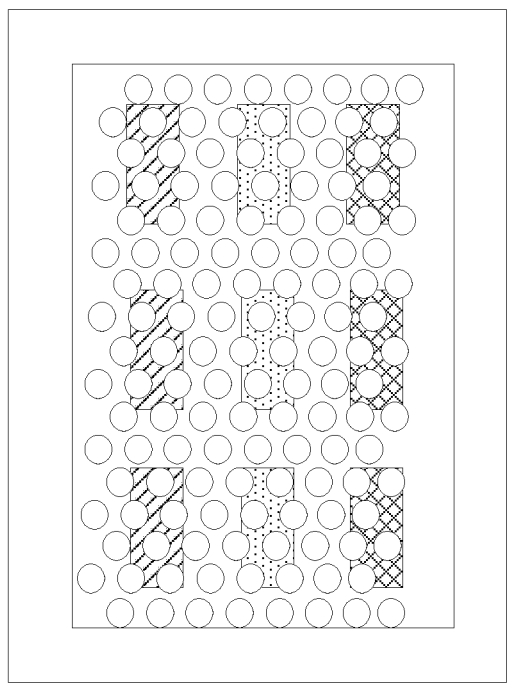
FIG. 2 is a schematic view illustrating the planar structure after an organic insulating material is coated.
Figure 3:
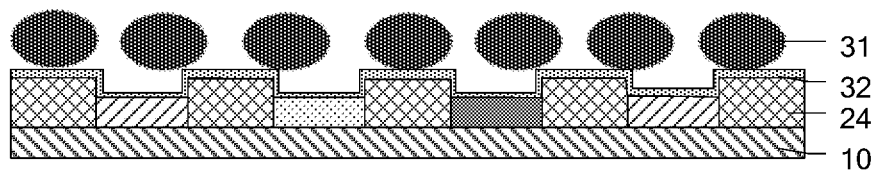
FIG. 3 is a schematic view illustrating the sectional structure after an organic insulating material is coated.
Figure 4:
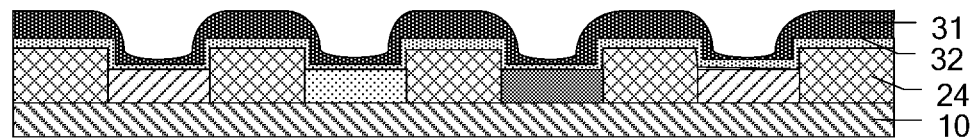
FIG. 4 is a schematic view illustrating the sectional structure during leveling of an organic insulating material.
Figure 5:
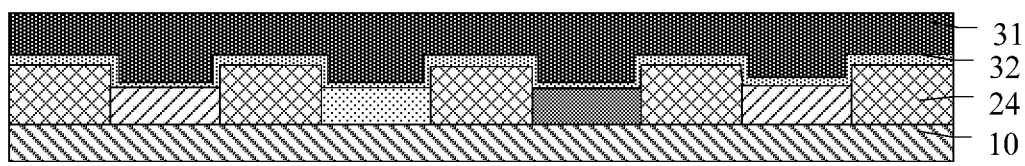
FIG. 5 is a schematic view illustrating the sectional structure after an organic insulating material is solidified.

For example, FIG. 2 is a schematic view illustrating the planar structure after an organic insulating material is coated, and as shown in FIG. 2, droplets formed of the organic insulating material are distributed evenly on the OLED. For example, FIG. 3 is a schematic view illustrating the sectional structure after an organic insulating material is coated, and as shown in FIG. 3, thickness of a pixel defining layer 24 is relatively large, individual sub-pixels are formed within slit areas formed by partition of pixel defining layer 24, and due to the larger size of droplets formed of the organic insulating material, the organic droplets suspend over pixel regions. For example, FIG. 4 is a schematic view illustrating the sectional structure during leveling of an organic insulating material, and as shown in FIG. 4, it is not easy for the droplets of the organic insulating material at the interface between the pixel defining layer 24 and a sub-pixel to spread out. The spreading process of droplets of the organic insulating material is described below. When the organic insulating material is in an initial state of the leveling process, the spreading speeds of droplets of the organic insulating material in a transverse direction and in a longitudinal direction in parallel to the sub-pixel edges (length of a pixel edge in the longitudinal direction is greater than length of a pixel edge in the transverse direction) respectively are the same. Because there is a step at the interface between the pixel defining layer and a sub-pixel in the transverse direction in parallel to sub-pixel edges, droplets of the organic insulating material will encounter the hindrance in the transverse direction of the sub-pixel edges during spreading, and will diffuse in accordance with the previous spreading speed in the longitudinal direction. So, a directional mura will occur in the direction parallel to the long sides of a sub-pixel shown in FIG. 1, and in turn, the display effect of the electroluminescent display panel is affected. For example, FIG. 5 is a schematic view illustrating the sectional structure after an organic insulating material is solidified, and as can be seen from FIG. 5, an organic insulating layer formed by spreading of an organic insulating material is spread flatly on a first inorganic insulating layer, serving a function of planarization, however, a subsequent phenomenon of uneven display on the electroluminescent display panel will occur, and the display effect is affected.

In at least one embodiment of the present disclosure, an electroluminescent display panel is provided, which includes a base substrate, pixel structures disposed on the base substrate, and an encapsulating film disposed on the pixel structures. The pixel structures are arranged in an array, the pixel structure includes a plurality of sub-pixels arranged in an array, the pixel structure array has a first direction and a second direction intersected with each other, and an edge of a sub-pixel includes a first portion gradually away from a straight line where the first direction lies on gradually, the extending direction of which does not coincide with a second direction. The first direction refers to a direction where a leveling operation is conducted on an organic film. According to embodiments of the present disclosure, by micro-processing the shape of the edge of a sub-pixel, namely, by arranging edge of a sub-pixel to include a first portion gradually away from the straight line where the first direction lies and misaligning the extending direction of the first portion with a second direction, mura formed in this way will not occur regularly, and thus mura becomes unconspicuous, and cannot achieve the extent to which human eyes can perceive. In this way, mura can be eliminated visually.

Figure 6:
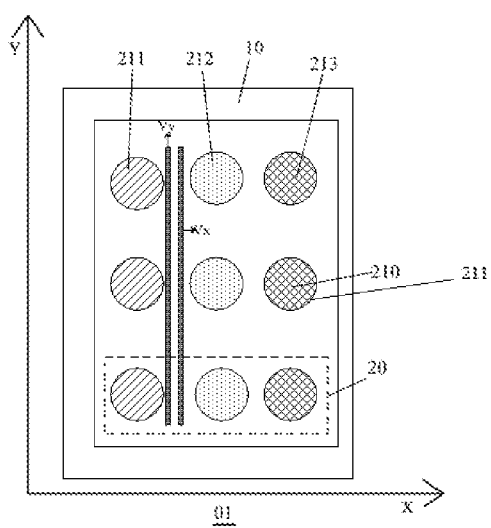
FIG. 6 is a schematically structural plan view illustrating morphology of a pixel edge provided by an embodiment of the present disclosure.
Figure 7:
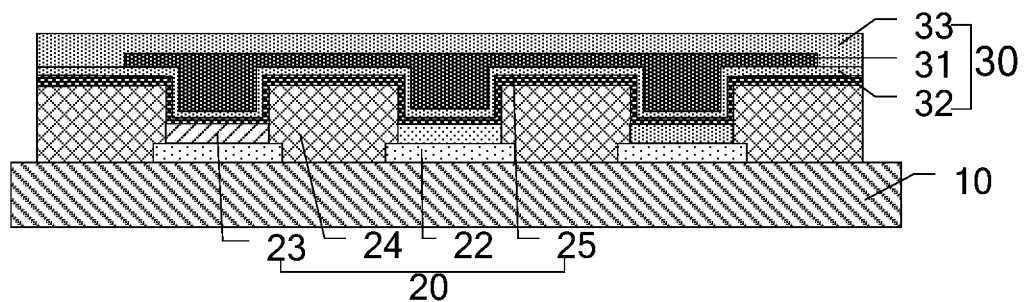
FIG. 7 is a schematically structural cross-section view illustrating an electroluminescent display panel provided by an embodiment of the present disclosure.

In at least one embodiment of the present disclosure, an electroluminescent display panel is provided. For example, FIG. 6 is a schematically structural plan view illustrating morphology of a pixel edge in an electroluminescent display panel provided by an embodiment of the present disclosure; FIG. 7 is a schematically structural sectional view illustrating an electroluminescent display panel provided by an embodiment of the present disclosure. As shown in FIG. 6 and FIG. 7, the electroluminescent display panel 01 includes a base substrate 10, an organic light-emitting diode (OLED) pixel structure 20 disposed on the base substrate 10, and an encapsulating film 30 disposed on the OLED pixel structure 20, and the OLED pixel structure 20 is arranged in an array, and includes a plurality of sub-pixel 210 arranged in an array. The OLED pixel structure 20 array has a first direction (e.g., Y direction) and a second direction (e.g., X direction) intersected with each other, the edge of the sub-pixel 210 includes a first portion gradually away from a straight line where the first direction (e.g., Y direction) lies, and the extending direction of the first portion does not coincide with the second direction (e.g., X direction).

For example, as shown in FIG. 6, at least the edge of each sub-pixel 210 along the first direction (e.g., Y direction) is a curve. For example, shape of the sub-pixel 210 includes at least one of a circle, ellipse, and a quadrangle in a snake-liked shape along the first direction.

It is to be noted that the planar structure of each sub-pixel 210 is a circle shown in FIG. 6, and in FIG. 8, FIG. 9 and FIG. 10 described below, the planar structure of each sub-pixel 210 may be an ellipse, a quadrangle in a snake-liked shape along the first direction and a regular hexagon, respectively, the sub-pixel corresponding to a light-emitting region; "along the first direction" in embodiments of the present disclosure refers to a case of parallel to the first direction or approximately parallel to the first direction.

As can be seen from FIG. 6, planar shape of the edge of each sub-pixel 210 is a circle, and its edge along the first direction (Y direction) is a curve roughly. As shown in FIG. 6, for each sub-pixel 210, besides its edge along the first direction (Y direction) being a curve, its edge along a second direction (X direction) is also a curve, and thus irregularity of unevenness/mura is further enhanced. Consequently, the phenomenon of display unevenness is weakened or even eliminated. The first direction is a direction in which a leveling operation is conducted on an organic film along the direction parallel to Y-axis in FIG. 6, for example, and the second direction is a direction in which a leveling operation is conducted on an organic film along the direction parallel to X-axis in FIG. 6, for example.

Figure 8:
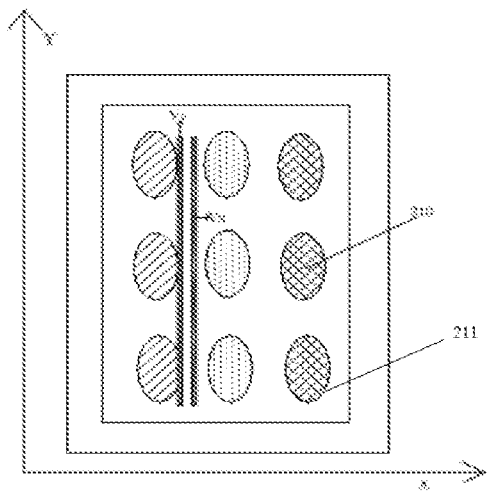
FIG. 8 is a schematically structural plan view illustrating another morphology of a pixel edge provided by an embodiment of the present disclosure.

For example, FIG. 8 is a schematically structural plan view illustrating edge morphology of yet another pixel provided by an embodiment of the present disclosure. As shown in FIG. 8, morphology of the edge of the sub-pixel 210 is an ellipse, an edge of the sub-pixel 210 along a first direction (Y direction) is a curve, and its edge along a second direction (X direction) is also a curve. In this way, irregularity of mura is further enhanced as well. Consequently, the phenomenon of display unevenness is weakened or even eliminated.

Figure 9:
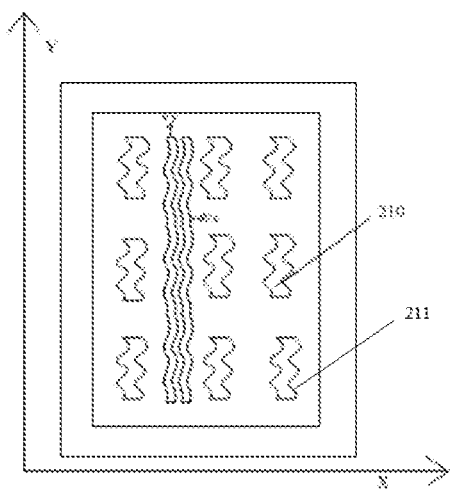
FIG. 9 is a schematically structural plan view illustrating yet another morphology of a pixel edge provided by an embodiment of the present disclosure.
Figure 10:
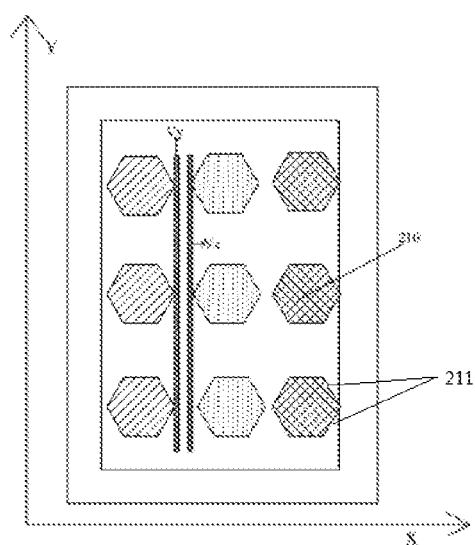
FIG. 10 is a schematically structural plan view illustrating yet another morphology of a pixel edge provided by an embodiment of the present disclosure.

For example, FIG. 9 is a schematically structural plan view illustrating morphology of yet another pixel edge provided by an embodiment of the present disclosure. As shown in FIG. 9, morphology of the edge of the sub-pixel 210 is a quadrangle in a snake-liked shape along a first direction, and at least the edge along the first direction (Y direction) of each sub-pixel 210 is a curve roughly. Similarly, morphology of the edge of the sub-pixel 210 may be a polygon in the snake-liked shape along the first direction and whose side number is greater than 4; for example, it may be a pentagon, hexagon, octagon or the like in the snake-liked shape along the first direction; or, it may be a quadrangle or a polygon whose side number is greater than 4 in the snake-liked shape along both the first direction and the second direction; for example, it may be a pentagon, hexagon, octagon or the like in the snake-liked shape along both the first direction and the second direction.

The pixel edge morphology shown in FIG. 6, FIG. 8 and FIG. 9 allows droplets of an organic insulating material not to produce a regular mura during spreading due to difference in flowing state along the first direction and the second direction. By designing an edge of a sub-pixel along a first direction (Y direction) into a curve, the regular mura can be made to become irregular, so as to allow an uneven state to be lower than the extent of mura to which human eyes can perceive it, and then, the mura can be eliminated visually.

For example, edge shape of each sub-pixel 210 includes a polygon whose side number is greater than 4. For example, edge shape of a sub-pixel 210 may be a regular pentagon, regular hexagon, regular octagon or other regular polygon; or, edge shape of a sub-pixel 210 may be an irregular pentagon, hexagon, octagon or the like. For example, FIG. 10 is a schematically structural plan view illustrating morphology of yet another pixel edge provided by an embodiment of the present disclosure, and as shown in FIG. 10, edge shape of a sub-pixel 210 is a regular hexagon. In this way, the edge of a sub-pixel is configured to include a first portion gradually away from the straight line where the first direction lies, the extending direction of the first portion does not coincide with a second direction, so that regular mura can be made to become irregular, so as to allows an uneven state to be lower than the extent of mura to which human eyes can perceive it, and then, mura can be eliminated visually.

For example, as shown in FIG. 6, the sub-pixel 210 includes a first sub-pixel 211, a second sub-pixel 212 and a third sub-pixel 213. For example, colors of the first sub-pixel 211, the second sub-pixel 212 and the third sub-pixel 213 may differ from each other, and are one of a red sub-pixel, a green sub-pixel and a blue sub-pixel, respectively. For example, the first sub-pixel 211, the second sub-pixel 212 and the third sub-pixel 213 may be a red sub-pixel, a green sub-pixel and a blue sub-pixel, respectively. For example, colors of the first sub-pixel 211, the second sub-pixel 212 and the third sub-pixel 213 may be the same, and each corresponds to any one of a red sub-pixel, a green sub-pixel and a blue sub-pixel, so as to realize monochromatic display. That is, the OLED pixel structure in the electroluminescent display panel shown in FIG. 6 may be a monochromatic light-emitting structure, and may be a multicolor light-emitting structure.

For example, as shown in FIG. 6, each OLED pixel structure includes a first sub-pixel 211, a second sub-pixel 212 and a third sub-pixel 213.

For example, in a first direction, adjacent sub-pixels are arranged in an axially symmetric manner with respect to the straight line where the second direction lies; in a second direction, adjacent sub-pixels are arranged in a symmetric manner with respect to the straight line where the first direction lies. In this case, the straight line where the first direction lies and the straight line where the second direction lies are perpendicular to each other.

It is to be noted that embodiments of the present disclosure may be directed to an electroluminescent display panel whose pixel arrangement is horizontal-vertical arrangement with side-by-side RGB, or may be directed to an electroluminescent display panel with an arrangement not in horizontal and longitudinal directions, for example, an arrangement with a diamond-like structure, a rhombohedral structure, or the like.

For example, as shown in FIG. 7, the encapsulating film at least includes an inorganic insulating layer and an organic insulating layer disposed on each other. For example, the inorganic insulating layer includes a first inorganic insulating layer 32 provided between an organic insulating layer 31 and an OLED pixel structure 20 and a second inorganic insulating layer 33 disposed on the organic insulating layer 31.

For example, material of the organic insulating layer 31 includes at least one of acrylic resins, and it is to be noted that material of the organic insulating layer 31 is not limited to those mentioned above, and any other organic material which can meet planarization requirements may be used as the material of the organic insulating layer 31.

For example, thickness of the organic insulating layer 31 is in a range of 100 nm to 500 nm. For example, thickness of the organic insulating layer 31 is 100 nm, 200 nm, 300 nm, 400 nm, or 500 nm.

For example, materials of the first inorganic insulating layer 32 and the second inorganic insulating layer 33 each may include at least one of silicon nitride (SiNx), silicon oxide (SiOx), silicon oxynitride (SiNOx), titanium dioxide ($TiO_2$), or aluminium oxide ($Al_2O_3$). For example, the first inorganic insulating layer 32 and the second inorganic insulating layer 33 may be a single-layered structure, a bilayered structure or a three-layered structure formed by any of the above materials.

For example, in FIG. 7, the first inorganic insulating layer 32 and the second inorganic insulating layer 33 in the aforesaid encapsulating film 30 can achieve the function of obstructing water and oxygen gas. Bendable capacity of the first inorganic insulating layer 32 and the second inorganic insulating layer 33 is poor, and when the first inorganic insulating layer 32 and the second inorganic insulating layer 33 are bended, they are easily broken. The organic insulating layer 31 interposed between the first inorganic insulating layer 32 and the second inorganic insulating layer 33 can achieve a function of releasing stress, so as to reduce the damage to the first inorganic insulating layer 32 and the second inorganic insulating layer 33 by the bending process, and can also play the role of planarization. It is to be noted that, in addition to the first inorganic insulating layer 32 and the second inorganic insulating layer 33, the encapsulating film may further include more layers of inorganic insulating layers that are disposed in stack, so as to achieve better obstruction to water and oxygen gas. The encapsulating film 30 formed of the first inorganic insulating layer 32, the second inorganic insulating layer 33 and the organic insulating layer 31 can meet the demand of obstruction to water and oxygen gas, function as a planarization, and facilitate narrow frame design of OLED display panels.

Figure 11:
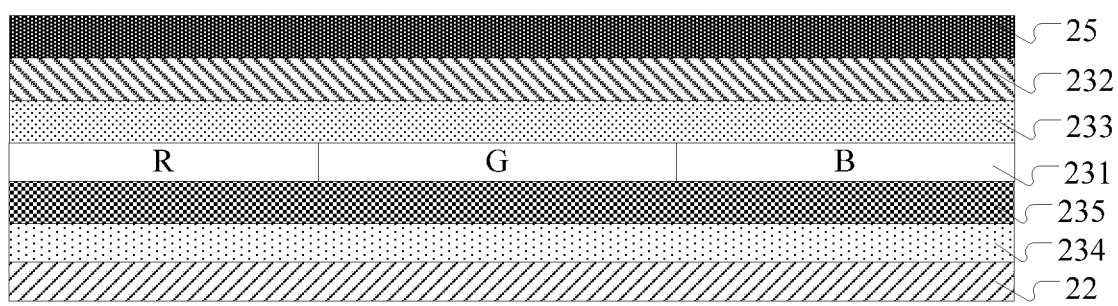
FIG. 11 is a schematically structural cross-section view illustrating an OLED pixel structure provided by an embodiment of the present disclosure.

For example, as shown in FIG. 7, the OLED pixel structure 20 includes a first electrode 22, an organic insulating material functional layer 23 and a second electrode 25 disposed in stack. For example, FIG. 11 is a schematically structural sectional view illustrating an OLED pixel structure provided by an embodiment of the present disclosure, and in this OLED pixel structure, an organic material functional layer 23 may include a light-emitting layer 231, an electron injection layer 232, an electron transportation layer 233, a hole injection layer 234 and a hole transportation layer 235.

For example, the electroluminescent display panel further includes a pixel defining layer 24 provided between adjacent OLED pixel structures, and a sub-pixel corresponds to an opening region of the pixel defining layer 24.

For example, thickness of the pixel defining layer 24 is in a range of 1 μm to 1.5 μm. For example, thickness of the pixel defining layer 24 may be 1 μm, 1.2 μm, 1.4 μm, or 1.5 μm.

For example, the pixel defining layer 24 may be used for separating two adjacent pixel structures. For example, the pixel defining layer 24 is usually formed by organic insulating material (e.g., acrylic resins) or inorganic insulating material (e.g., silicon nitride (SiNx), or silicon oxide (SiOx)), and the pixel defining layer 24 has an insulating property.

For example, as shown in FIG. 11, in order to effectively enhance the light-emitting efficiency of an organic material functional layer 23 in the pixel structure, a first electrode 22 is the anode, a hole transportation layer 235 is provided between the first electrode 22 and a light-emitting layer 231, and the hole transportation layer 235 is formed by a solution process. A second electrode 25 is a cathode, an electron transportation layer 233 is provided between the second electrode 25 and the light-emitting layer 231, and the electron transportation layer 233 is formed by a vacuum thermal evaporation process.

For example, thickness of the hole transportation layer 234 is in a range of 10 nm to 180 nm, and material of the hole transportation layer 235 includes polytriphenylamine (PTPAn).

For example, thickness of the electron transportation layer 233 is in a range of 10 nm to 35 nm, and material of the electron transportation layer 233 is (8-hydroxyquinoline) aluminum.

For example, as shown in FIG. 11, the organic material functional layer 23 may further include an electron injection layer 232 provided between the second electrode 25 and the electron transportation layer 233; and a hole injection layer 234 provided between the first electrode 22 and the hole transportation layer 235.

For example, thickness of the hole injection layer 234 is in a range of 10 nm to 180 nm; and thickness of the electron injection layer 232 is in a range of 1 nm to 5 nm.

For example, material of the hole injection layer 234 includes any one of poly(3,4-ethylenedioxythiophene)-polystyrene sulfonate (PEDOT/PSS), polythiophene and polyphenylamine Material of the hole injection layer may also be tri-[4-(5-phenyl-2-thienyl)phenyl]amine], 4,4',4"-tri[2-naphthyl(phenyl)amino]triphenylamine (2-TNATA), 4,4', 4"-tri-(3-methylphenylphenylamino)triphenylamine (m-MTNATA), copper phthalocyanine (CuPc) or TPD.

For example, material of the electron injection layer 232 includes any one of LiF and 8-hydroxyquinolinolato-lithium or their combination. The electron injection layer may also adopt an alkali metal oxide, other alkali metal fluoride or the like. The alkali oxide includes lithium oxide ($Li_2O$), lithium boron oxide ($LiBO_2$), potassium silicate ($K_2SiO_3$), cesium carbonate ($Cs_2CO_3$) or the like; and the alkali metal fluoride includes sodium fluoride (NaF) or the like.

It is to be noted that one of the first electrode 22 and the second electrode 25 is an anode, and the other is a cathode. In addition to the above embodiment in which the first electrode 22 functions as a anode and the second electrode 25 functions as a cathode, it is also possible that the first electrode functions as a cathode, and the second electrode functions as an anode. Electrode material forming the anode includes indium tin oxide, zinc oxide or other transparent conductive material; and electrode material forming the cathode includes aluminum, magnesium or an alloy formed of the two metals.

For example, in an electroluminescent display panel provided by an embodiment of the present disclosure, the electroluminescent display panel is a flexible display panel, and it is to be noted that electroluminescent display panel provided by embodiments of the present disclosure may be an OLED panel of any type and is not limited to a flexible display panel. Embodiments of the present disclosure aim to improve morphology of the pixel edge, so as to reduce mura introduced by an organic insulating layer in an encapsulating film structure, a common flexible display panel will adopt a film encapsulating process, while a non-flexible panel may also be encapsulated by adopting a glass frit sintering process at present, and not necessarily by adopting a film encapsulating process, so they are also suitable for non-flexible panels produced by using the film encapsulating process.

For example, the base substrate 10 may be an oxide film transistor substrate, a low temperature polysilicon substrate, a glass substrate or a substrate formed of resin material.

According to at least one embodiment of the present disclosure, a display device is also provided, which includes any of aforesaid electroluminescent display panels.

For example, the display device may be a cell phone, tablet computer, television, display, notebook computer, digital photo frame, navigator or any other product or component with a display function. For other requisite constituent parts of the display device, each of which shall be possessed as understood by a person of ordinary skill in the art, unnecessary details will not be given here, and it shall not be used as limitative of the present disclosure, either. Regarding implementations of the display device, reference to any of above embodiments of electroluminescent display panel can be made, repetitions are omitted here.

Figure 12:
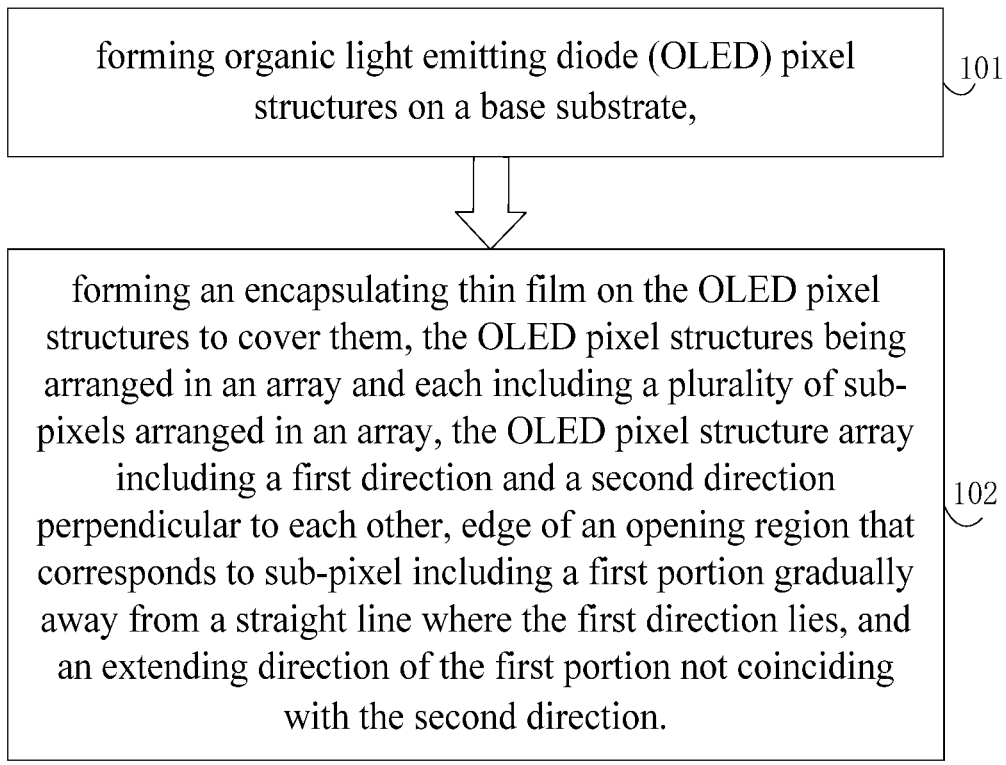
FIG. 12 is a schematic flowchart illustrating manufacturing method of an electroluminescent display panel provided by an embodiment of the present disclosure.

According to at least one embodiment of the present disclosure, a manufacturing method of an electroluminescent display panel is also provided. For example, FIG. 12 is a flowchart illustrating of a manufacturing method of an electroluminescent display panel provided by an embodiment of the present disclosure. As shown in FIG. 12, the manufacturing process includes following operations.

Step 101, organic light-emitting diode (OLED) pixel structures are formed on a base substrate.

For example, the base substrate may be an oxide film transistor substrate, a low temperature polysilicon substrate, a glass substrate, or a substrate formed of a resin material.

For example, each of the OLED pixel structures include a first electrode, an organic material functional layer and a second electrode disposed one on another, and the organic material functional layer may include a light-emitting layer, an electron injection layer, an electron transportation layer, a hole injection layer and a hole transportation layer.

For example, the manufacturing method of the electroluminescent display panel also includes forming a pixel defining layer between adjacent OLED pixel structures. Edge of a sub-pixel corresponds to an opening region of the pixel defining layer, and thickness of the pixel defining layer is in a range of 1 μm to 1.5 μm.

For example, regarding materials and thickness design of the first electrode, the organic material functional layer, the pixel defining layer and the second electrode, and a light-emitting layer, an electron injection layer, an electron transportation layer, a hole injection layer and a hole transportation layer in the organic material functional layer, reference can be made to relevant descriptions in the above embodiments, and unnecessary details will not be given here.

Step 102, an encapsulating film is formed on the OLED pixel structures to cover the OLED pixel structures. The OLED pixel structures are arranged in an array, the OLED pixel structure includes a plurality of sub-pixels arranged in an array, the OLED pixel structure array has a first direction and a second direction intersected with each other, and the edge of a sub-pixel includes a first portion gradually away from the straight line where the first direction lies, the extending direction of which does not coincide with a second direction.

For example, at least one edge of each sub-pixel 210 along a first direction (e.g., Y direction) is a curve roughly. For example, edge shape of the sub-pixel 210 includes at least one of a circle, an ellipse, and a quadrangle in a snake-liked shape along the first direction.

When planar shape of the edge of each sub-pixel is a circle, its edge along the first direction (Y direction) is a curve roughly. For each sub-pixel, besides its edge along the first direction (Y direction) being a curve, its edge along a second direction (X direction) is also a curve, and thus irregularity of mura is further enhanced. In this way, the phenomenon of display unevenness is weakened or even eliminated. The first direction is a direction in which a leveling operation is conducted on an organic film along the direction parallel to Y-axis, for example; and the second direction is a direction in which a leveling operation is conducted on an organic film along the direction parallel to X-axis, for example.

For example, morphology of the edge of the sub-pixel is an ellipse, its edge along a first direction (Y direction) is a curve, its edge along a second direction (X direction) is also a curve, and so irregularity of mura is further enhanced. In this way, the phenomenon of display unevenness is weakened or even eliminated.

For example, morphology of the edge of the sub-pixel is a quadrangle in a snake-liked shape along a first direction, and at least the edge of each sub-pixel along the first direction (Y direction) is a curve. Similarly, morphology of the edge of the sub-pixel may also be a polygon in the snake-liked shape along the first direction and whose side number is greater than 4; for example, it may be a pentagon, hexagon, octagon or the like in the snake-liked shape along the first direction; or, it may be a quadrangle or a polygon whose side number is greater than 4 in the snake-liked shape along both the first direction and the second direction; for example, it may be a pentagon, hexagon, octagon or the like in the snake-liked shape along both the first direction and the second direction.

For example, edge shape of each sub-pixel includes a polygon whose side number is greater than 4. For example, edge shape of a sub-pixel may be a regular pentagon, regular hexagon, regular octagon or other regular polygonor; or, edge shape of a sub-pixel may be an irregular pentagon, hexagon, octagon or the like.

At least the edge of each sub-pixel along a first direction (Y direction) is a curve roughly or the shape of each sub-pixel includes a polygon whose side number is greater than 4, droplets formed of an organic insulating material will not generate a regular mura during spreading due to difference in flowing state along the first direction and the second direction. By designing an edge of each sub-pixel along a first direction (Y direction) into a curve or when the shape of each sub-pixel includes a polygon whose side number is greater than 4, the regular mura can be made to become irregular. This allows an uneven state to be lower than the extent of mura to which human eyes can perceive it, and then, mura can be eliminated visually.

For example, in a first direction, adjacent sub-pixels are symmetrically arranged with respect to the straight line where a second direction lies; in a second direction, adjacent sub-pixels are symmetrically arranged with respect to the straight line where a first direction lies.

For example, the encapsulating film at least includes an inorganic insulating layer and an organic insulating layer disposed one on another.

For example, the inorganic insulating layer includes a first inorganic insulating layer provided between an organic insulating layer and a pixel structure, and a second inorganic insulating layer disposed on the organic insulating layer.

For example, the first inorganic insulating layer and the second inorganic insulating layer in the encapsulating film can obstruct water and oxygen gas. Bendable capacity of the first inorganic insulating layer and the second inorganic insulating layer is poor, and when the first inorganic insulating layer and the second inorganic insulating layer are bended, they are easily broken. The organic insulating layer interposed between the first inorganic insulating layer and the second inorganic insulating layer can release stress, so as to reduce the damage to the first inorganic insulating layer and the second inorganic insulating layer by the bending process, and can also play the role of planarization. It is to be noted that, in addition to the first inorganic insulating layer and the second inorganic insulating layer, the encapsulating film may also include more layers of inorganic insulating layers that are disposed one on another, so as to achieve better obstruction to water and oxygen gas. The encapsulating film formed of the first inorganic insulating layer, the second inorganic insulating layer and the organic insulating layer can meet the demand of obstruction to water and oxygen gas, function as a planarization, and facilitate narrow frame design of OLED display panels.

For example, in the manufacturing method provided by embodiments of the present disclosure, method of forming the encapsulating film at least includes any process of coating, ink-jet printing or printing.

For example, the manufacturing method provided by embodiments of the present disclosure also includes utilizing a vacuum equipment to prepare the first inorganic insulating layer and the second inorganic insulating layer. For example, a plasma enhanced chemical vapor deposition process or a sputtering process is adopted to form the first inorganic insulating layer and the second inorganic insulating layer.

For example, the manufacturing method provided by embodiments of the present disclosure also includes forming a pixel defining layer among adjacent OLED pixel structures. A sub-pixel corresponds to an opening region of the pixel defining layer, and thickness of the pixel defining layer is in a range of 1 μm to 1.5 μm.

The electroluminescent display panel and manufacturing method thereof, the display device provided by at least one embodiment of the present disclosure have at least one of the following beneficial effects:

(1) in the electroluminescent display panel provided by at least one embodiment of the present disclosure, by arranging the edge of a sub-pixel to include a first portion gradually away from the straight line where a first direction lies, the extending direction of which does not coincide with a second direction, in the procedure of producing subsequent film encapsulating layer, the spreading effect of the organic film can be enhanced.

(2) in the electroluminescent display panel provided by at least one embodiment of the present disclosure, reliability of encapsulation can be promoted, and display quality of the electroluminescent display panel is raised.

The following points need to be noted:

(1) The accompanying drawings in the embodiments of the present disclosure only involve structures relevant to the embodiments of the present disclosure, and other structures may refer to a common design.

(2) For clarity, in the accompanying drawings of the embodiments of the present disclosure, the thickness of layers or regions is enlarged or reduced. That is, the accompanying drawings are not drawn according to actual scales. It can be understood that, when an element such as a layer, film region, substrate or the like is referred to as being located "on" or "under" another element, the element may be "directly" located "on" or "under" another element, or there may be an intermediate element.

(3) Without conflict, the embodiments of the present disclosure and the features in the embodiments can be combined with each other to obtain new embodiments.

The described above are only specific embodiments of the present disclosure, and the present disclosure is not intended to be limited thereto. The scope of the present disclosure is defined by the claims.

What is claimed is:

1. An electroluminescent display panel, comprising,
a base substrate,
a pixel defining layer on the base substrate;
pixel structures formed by partitions of the pixel defining layer on the base substrate;
an encapsulating layer provided on the pixel structures;
wherein the pixel structures are arranged in an array, each pixel structure comprises a plurality of sub-pixels arranged in an array, the pixel structure array has a first direction and a second direction intersected with each other, an edge of each of the sub-pixels comprises a first portion which gradually extends away from a straight line along which the first direction extends in, and an extending direction of the first portion does not coincide with the second direction;
wherein each sub-pixel corresponds to an opening region of the pixel defining layer, the encapsulating layer comprises an organic insulating layer, at least part of the organic insulating layer is filled in the opening regions, and the organic insulating layer covers an upper surface of the pixel defining layer away from the base substrate and at least two adjacent opening regions of the pixel defining layer; and
wherein each pixel structure further comprises an organic functional layer having a thickness less than a thickness of the organic insulating layer on the organic functional layer, a cross-section of at least one of the sub-pixels in a plane defined by the first direction and the second direction has an entirely curved shape, and at least two opposite edges of the cross-section of the at least one of the sub-pixels along the extending direction of the first portion are roughly parallel to each other.

2. The electroluminescent display panel according to claim 1, wherein the encapsulating layer further comprises at least one inorganic insulating layer which is arranged with the organic insulating layer one on the other.

3. The electroluminescent display panel according to claim 2, wherein the inorganic insulating layer comprises a first inorganic insulating layer provided between the organic insulating layer and the pixel structures, and a second inorganic insulating layer disposed on the organic insulating layer.

4. The electroluminescent display panel according to claim 1, wherein the pixel structures comprise a first electrode, and a second electrode, which are arranged one on another.

5. The electroluminescent display panel according to claim 4, wherein each of the OLED pixel structures comprises a first sub-pixel, a second sub-pixel and a third sub-pixel.

6. The electroluminescent display panel according to claim 2, wherein the first inorganic insulating layer and the second inorganic insulating layer each comprises material selected from a group consisting of silicon nitride (SiNx), silicon oxide (SiOx), silicon oxynitride (SiNOx), titanium dioxide ($TiO_2$), and aluminium oxide ($Al_2O_3$).

7. The electroluminescent display panel according to claim 4, the organic functional layer comprises a light-emitting layer, an electron injection layer, an electron transportation layer, a hole injection layer, and a hole transportation layer.

8. The electroluminescent display panel according to claim 1, wherein a bottom profile of each opening region defined by the pixel defining layer near the base substrate has a shape similar to that of an upper profile of the opening away from the base substrate.

9. The electroluminescent display panel according to claim 4, wherein the second electrode is an integral structure on the organic functional layer.

10. The electroluminescent display panel according to claim 1, wherein the thickness of the organic layer filling in at least one opening region is larger than ½ of the total depth of the opening region of the pixel defining layer, and the pixel defining layer has a thickness in a range of 1 µm to 1.5 µm.

11. The electroluminescent display panel according to claim 2, wherein the first inorganic insulating layer covers the upper surface of the pixel defining layer away from the base substrate and the at least two adjacent openings of the pixel defining layer.

12. The electroluminescent display panel according to claim 4, wherein the first electrode, the organic functional layer, the second electrode, the first inorganic insulating layer, and the organic insulating layer are sequentially arranged in the opening regions.

13. The electroluminescent display panel according to claim 12, wherein the first electrode is an anode, the organic functional layer is a light-emitting layer, and the second electrode is a cathode.

14. The electroluminescent display panel according to claim 1, wherein the first inorganic insulating layer has a thickness less than that of the organic insulating layer in the opening regions of the pixel defining layer.

15. The electroluminescent display panel according to claim 13, wherein the light-emitting layer in adjacent regions of the pixel defining layer is discontinuous.

16. The electroluminescent display panel according to claim 1, wherein the first portion is a curved line, and each of the sub-pixels has a shape selected from a group consisting of circle, ellipse, and quadrangle which is snake-liked along the first direction.

17. A display device, comprising an electroluminescent display panel, wherein the electroluminescent display panel comprises,
a base substrate,
a pixel defining layer on the base substrate;

pixel structures formed by partitions of the pixel defining layer on the base substrate;

an encapsulating layer provided on the pixel structures;

wherein the pixel structures are arranged in an array, each pixel structure comprises a plurality of sub-pixels arranged in an array, the pixel structure array has a first direction and a second direction intersected with each other, an edge of each of the sub-pixels comprises a first portion which gradually extends away from a straight line along which the first direction extends in, and an extending direction of the first portion does not coincide with the second direction;

wherein each sub-pixel corresponds to an opening region of the pixel defining layer, the encapsulating layer comprises an organic insulating layer, at least part of the organic insulating layer is filled in the opening regions, and the organic insulating layer covers an upper surface of the pixel defining layer away from the base substrate and at least two adjacent opening regions of the pixel defining layer; and wherein each pixel structure further comprises an organic functional layer having a thickness less than a thickness of the organic insulating layer on the organic functional layer, a cross-section of at least one of the sub-pixels in a plane defined by the first direction and the second direction has an entirely curved shape, and at least two opposite edges of the cross-section of the at least one of the sub-pixels along the extending direction of the first portion are roughly parallel to each other.

18. A manufacturing method of an electroluminescent display panel, comprising, providing a base substrate;

forming a pixel defining layer with a plurality of opening regions on the base substrate; forming organic light-emitting-diode (OLED) pixel structures in the opening regions on the base substrate;

forming an encapsulating layer covering the pixel structures;

wherein the pixel structures are arranged in an array, each of the pixel structures comprises a plurality of sub-pixels arranged in an array, the array of pixel structures has a first direction and a second direction intersected with each other, an edge of each of the sub-pixels comprises a first portion which gradually extends away from a straight line along which the first direction extends in, and an extending direction of the first portion does not coincide with the second direction;

wherein each sub-pixel corresponds to an opening region of the pixel defining layer, the encapsulating layer comprises an organic insulating layer, at least part of the organic insulating layer is filled in the opening regions, and the organic insulating layer covers an upper surface of the pixel defining layer away from the base substrate and at least two adjacent opening regions of the pixel defining layer; and wherein each pixel structure further comprises an organic functional layer having a thickness less than a thickness of the organic insulating layer on the organic functional layer, a cross-section of at least one of the sub-pixels in a plane defined by the first direction and the second direction has an entirely curved shape, and at least two opposite edges of the cross-section of the at least one of the sub-pixels along the extending direction of the first portion are roughly parallel to each other.

19. The manufacturing method according to claim 18, wherein the encapsulating film further comprises at least one inorganic insulating layer, which is arranged with the organic insulating layer one on the other.

20. The manufacturing method according to claim 19, wherein the inorganic insulating layer comprises a first inorganic insulating layer provided between the organic insulating layer and the pixel structures, and a second inorganic insulating layer disposed on the organic insulating layer.

* * * * *